(12) United States Patent
Nagaluru et al.

(10) Patent No.: US 11,661,950 B2
(45) Date of Patent: May 30, 2023

(54) DIAGNOSTIC SYSTEM FOR A VEHICLE

(71) Applicant: LG Chem, Ltd., Seoul (KR)

(72) Inventors: Sagar Nagaluru, Warren, MI (US);
Sandeep Vankineni, Warren, MI (US);
Nitin Bharane, Rochester Hills, MI (US)

(73) Assignee: LG Energy Solution, Ltd., Seoul (KR)

( * ) Notice: Subject to any disclaimer, the term of this patent is extended or adjusted under 35 U.S.C. 154(b) by 448 days.

(21) Appl. No.: 16/953,534

(22) Filed: Nov. 20, 2020

(65) Prior Publication Data

US 2022/0163042 A1 May 26, 2022

(51) Int. Cl.
| | | |
|---|---|---|
| G01R 31/50 | (2020.01) | |
| F04D 27/00 | (2006.01) | |
| G07C 5/08 | (2006.01) | |
| G01R 31/08 | (2020.01) | |
| G01R 23/02 | (2006.01) | |
| G07C 5/00 | (2006.01) | |
| B60R 16/023 | (2006.01) | |

(52) U.S. Cl.
CPC ........ *F04D 27/004* (2013.01); *B60R 16/0234* (2013.01); *F04D 27/001* (2013.01); *G01R 23/02* (2013.01); *G01R 31/08* (2013.01); *G01R 31/50* (2020.01); *G07C 5/006* (2013.01); *G07C 5/0808* (2013.01); *G07C 5/0816* (2013.01)

(58) Field of Classification Search
CPC ........ G01R 31/50; G01R 31/08; G01R 23/15; G01R 23/02; G07C 5/0816; F04D 27/00; F04D 27/004; B60R 16/0234
See application file for complete search history.

(56) References Cited

U.S. PATENT DOCUMENTS

| | | | | |
|---|---|---|---|---|
| 5,436,827 A | * | 7/1995 | Gunn | ........................ G05B 9/03 |
| | | | | 361/695 |
| 6,040,668 A | * | 3/2000 | Huynh | ............... G05D 23/1912 |
| | | | | 318/473 |
| 6,381,406 B1 | * | 4/2002 | Smith | ........................ H02P 6/08 |
| | | | | 388/859 |

(Continued)

FOREIGN PATENT DOCUMENTS

| | | |
|---|---|---|
| JP | 2013032946 A | 2/2013 |
| KR | 101393584 B1 | 5/2014 |
| KR | 101919875 B1 | 2/2019 |

*Primary Examiner* — Patrick Assouad
*Assistant Examiner* — Demetrius R Pretlow
(74) *Attorney, Agent, or Firm* — Buckert Patent & Trademark Law Firm PC; John F. Buckert

(57) ABSTRACT

A diagnostic system includes a fan control circuit coupled to an electric fan and a microcontroller, and a sense line coupled to the fan control circuit and the microcontroller. The fan control circuit outputs a fan command sense signal at a duty cycle through the sense line to the microcontroller. A tachometer generates a tachometer signal at a frequency indicative of the rotational speed of the electric fan. A fan tachometer circuit receives the tachometer signal and outputs the tachometer sense signal at a frequency to the microcontroller in response to the tachometer signal. The microcontroller sets a second diagnostic flag to an error value indicating that the sense line has impaired operation if the frequency of the tachometer sense signal is within a desired frequency range, and a first diagnostic flag is equal to a first error value.

11 Claims, 7 Drawing Sheets

(56) References Cited

U.S. PATENT DOCUMENTS

| | | | | |
|---|---|---|---|---|
| 7,151,349 B1* | 12/2006 | Williamson | | F04D 27/004 |
| | | | | 318/599 |
| 10,060,438 B2* | 8/2018 | Duan | | F04D 19/005 |
| 2003/0223172 A1* | 12/2003 | Priest | | H04M 19/08 |
| | | | | 361/103 |
| 2003/0234624 A1* | 12/2003 | Frankel | | G06F 1/206 |
| | | | | 318/268 |
| 2003/0234625 A1* | 12/2003 | Frankel | | G06F 1/206 |
| | | | | 318/268 |
| 2004/0232864 A1* | 11/2004 | Sunaga | | H02P 7/29 |
| | | | | 318/434 |
| 2006/0142901 A1* | 6/2006 | Frankel | | H05K 7/20209 |
| | | | | 700/300 |
| 2006/0291994 A1* | 12/2006 | Bok | | G05D 23/20 |
| | | | | 415/47 |
| 2014/0262134 A1* | 9/2014 | Arensmeier | | F24F 11/36 |
| | | | | 165/11.2 |
| 2015/0145456 A1* | 5/2015 | Jelenowski | | H02P 31/00 |
| | | | | 318/434 |
| 2016/0047390 A1* | 2/2016 | Tsai | | F04D 27/004 |
| | | | | 700/275 |
| 2017/0363095 A1 | 12/2017 | Katrak et al. | | |
| 2018/0373300 A1* | 12/2018 | Bhatia | | G06F 1/206 |
| 2019/0390864 A1* | 12/2019 | Lambert | | F24F 11/52 |
| 2020/0232471 A1* | 7/2020 | Hsu | | F04D 27/001 |
| 2021/0072273 A1* | 3/2021 | Chien | | F04D 27/001 |

\* cited by examiner

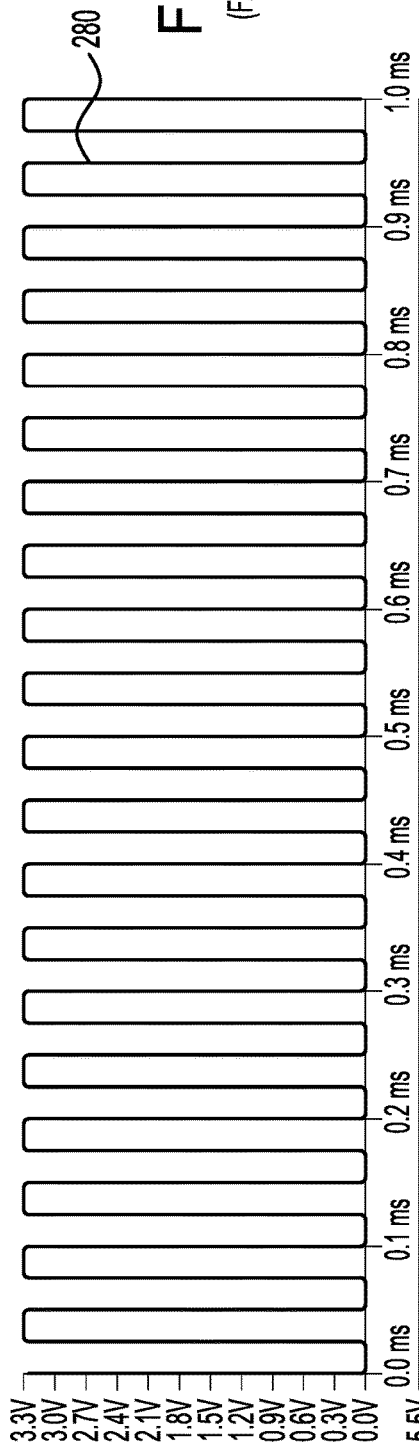
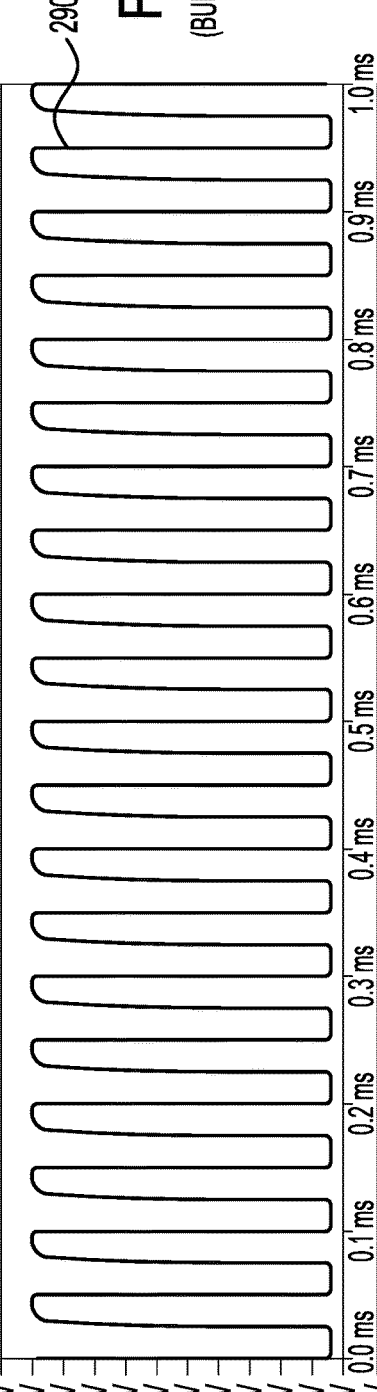
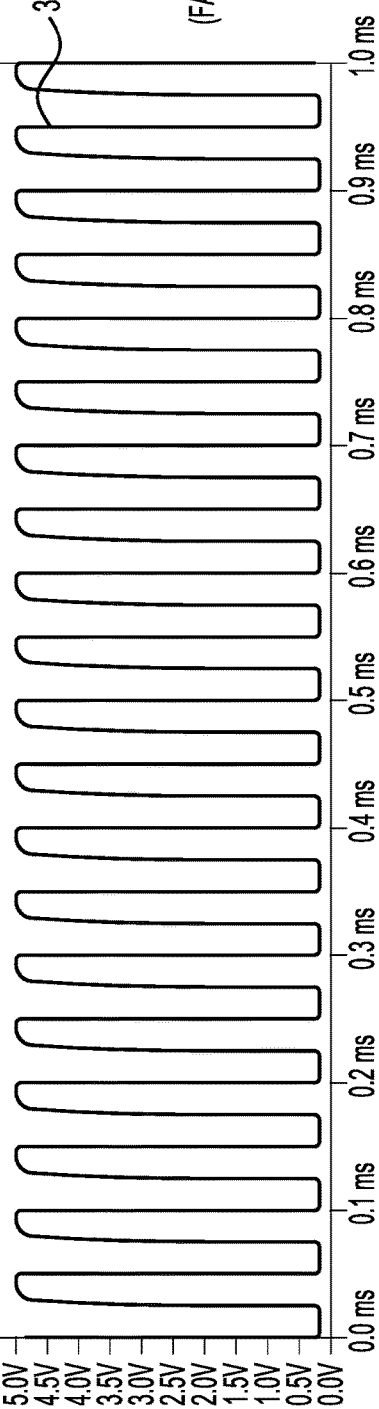

DIAGNOSTIC SYSTEM FOR A VEHICLE

BACKGROUND

Vehicles have utilized electric fans to cool components. However, diagnostic systems in vehicles have been unable to reliably determine when a fan control circuit controlling operation of an electric fan is electrically shorted to electrical ground or a high voltage, or when a voltage sense line coupled to the fan control circuit has impaired operation (e.g., is broken or electrically non-conductive).

The inventors herein have recognized a need for an improved diagnostic system for a vehicle that eliminates and/or minimizes the above-mentioned problems.

SUMMARY

A diagnostic system for a vehicle in accordance with an exemplary embodiment is provided. The diagnostic system includes a fan control circuit electrically coupled to an electric fan and a microcontroller, and a sense line electrically coupled to the fan control circuit and the microcontroller. The microcontroller generates a first fan command signal at a first duty cycle that is received by the fan control circuit. The fan control circuit outputs a first buffer fan command signal at a second duty cycle in response to the first fan command signal that is received by the electric fan. The second duty cycle is equal to the first duty cycle. The fan control circuit outputs a first fan command sense signal at a third duty cycle through the sense line to the microcontroller. The third duty cycle is equal to the first duty cycle. The diagnostic system further includes a tachometer that generates a first tachometer signal at a first frequency indicative of a rotational speed of the electric fan. The diagnostic system further includes a fan tachometer circuit that outputs a first tachometer sense signal at a second frequency in response to the first tachometer signal that is received by the microcontroller. The second frequency is equal to the first frequency. The microcontroller sets a first diagnostic flag to a first error value if the third duty cycle is outside of a first desired duty cycle range or the first tachometer sense signal is outside of a first desired frequency range. The microcontroller generates a second fan command signal at a fourth duty cycle that is received by the fan control circuit in response to the first diagnostic flag being set to the first error value. The fan control circuit outputs a second buffer fan command signal at a fifth duty cycle in response to the second fan command signal that is received by the electric fan. The fifth duty cycle is equal to the fourth duty cycle. The fan control circuit outputs a second fan command sense signal at a sixth duty cycle through the sense line to the microcontroller. The fifth duty cycle is equal to the fourth duty cycle. The tachometer generates a second tachometer signal at a third frequency indicative of the rotational speed of the electric fan. The fan tachometer circuit receives the second tachometer signal and outputs the second tachometer sense signal at a fourth frequency to the microcontroller in response to the second tachometer signal. The fourth frequency is equal to the third frequency. The microcontroller sets a second diagnostic flag to a second error value indicating that the sense line has impaired operation if the fourth frequency is within a second desired frequency range, and the first diagnostic flag is equal to the first error value.

BRIEF DESCRIPTION OF THE DRAWINGS

FIG. 3 is a schematic of an exemplary fan command signal (FAN_CMD) generated by a microcontroller in the diagnostic system of FIG. 1;

FIG. 4 is a schematic of an exemplary buffer fan command signal (BUFF_FAN_CMD) generated by the fan control circuit in the diagnostic system of FIG. 1;

FIG. 5 is a schematic of an exemplary fan command sense signal (FAN_CMD_SENSE) generated by the fan control circuit in the diagnostic system of FIG. 1;

DETAILED DESCRIPTION

Figure 1:
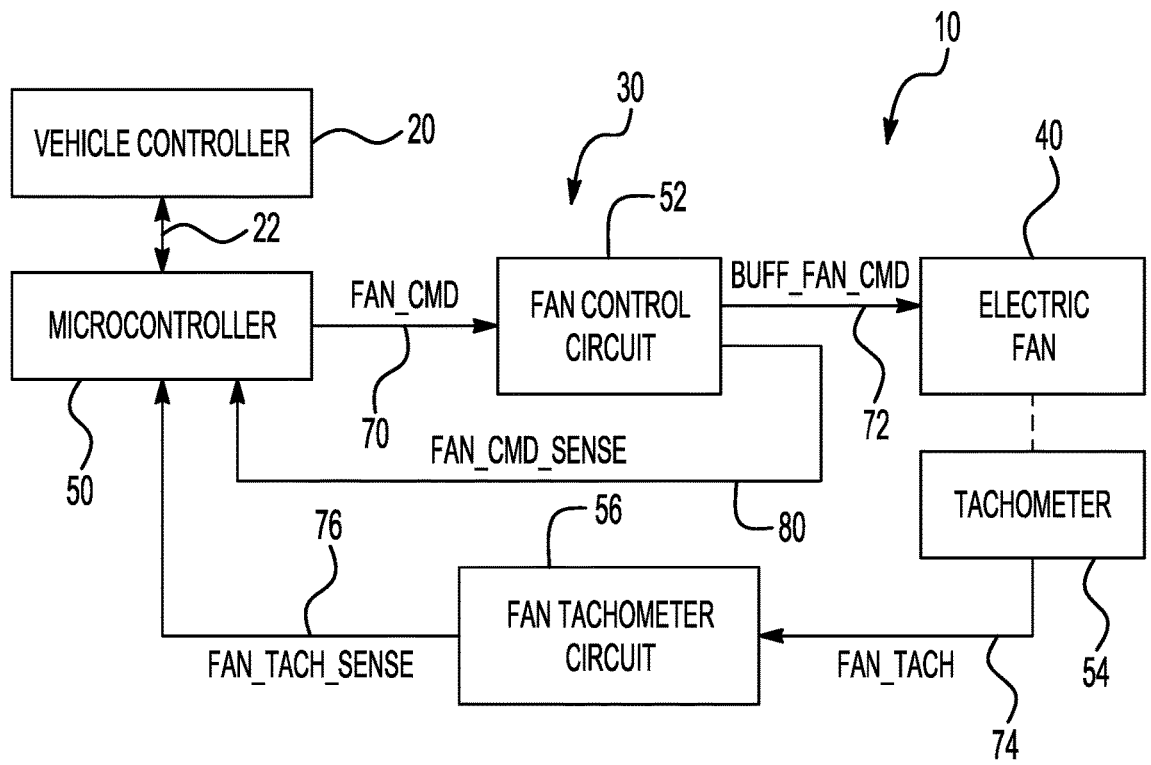
FIG. 1 is a block diagram of a vehicle having a diagnostic system in accordance with an exemplary embodiment.

Referring to FIG. 1, a vehicle 10 having a vehicle controller 20, a communication bus 22, a diagnostic system 30 in accordance with an exemplary embodiment, and an electric fan 40 is illustrated.

An advantage of the diagnostic system 30 is that the system 30 determines when a fan control circuit 52 controlling operation of electric fan 40 is electrically shorted to electrical ground or a high voltage (e.g., 48 volts), or when a voltage sense line 80 coupled to the fan control circuit 52 has impaired operation (e.g., is broken or electrically non-conductive).

The vehicle controller 20 is provided to received diagnostic flags from the microcontroller 50 of the diagnostic system 30. The vehicle controller 20 communicates with the microcontroller 50 utilizing a communication bus 22 operably coupled to both the vehicle controller 20 and the microcontroller 50.

As discussed above, the diagnostic system 30 is provided to determine when a fan control circuit 52 controlling operation of electric fan 40 is electrically shorted to electrical ground or a high voltage, or when a voltage sense line 80 coupled to the fan control circuit 52 has impaired operation (e.g., is broken). The diagnostic system 30 includes the microcontroller 50, the fan control circuit 52, a tachometer 54, a fan tachometer circuit 56, electrical lines 70, 72, 74, 76, and a sense line 80.

Referring to FIGS. 1 and 3, the microcontroller 50 is provided to generate a fan command signal (FAN_CMD) at a predetermined duty cycle that is received by the fan control circuit 52 via the electrical line 70. The fan command signal (FAN_CMD) is a pulse width modulated (PWM) signal as shown in the exemplary signal 280 of FIG. 3. The microcontroller 50 is further provided to receive a fan command sense signal (FAN_CMD_SENSE) from the fan control circuit 52. The fan command sense signal (FAN_CMD_SENSE) is a PWM signal as shown in the exemplary signal 300 of FIG. 5. The microcontroller 50 is further provided to receive a fan command sense signal (FAN_TACH_SENSE) from the fan tachometer circuit 56. The fan command sense signal (FAN_TACH_SENSE) is a PWM signal. The microcontroller 50 is further provided to set diagnostic flags based on the fan command sense signal (FAN_CMD_SENSE) and the fan command sense signal (FAN_TACH_SENSE) as will be described in greater detail below. The microcontroller 50 further sends the diagnostic flags to the vehicle controller 20 utilizing the communication bus 22.

Figure 6:
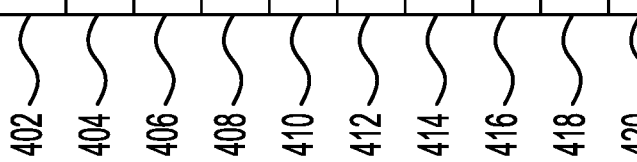
FIG. 6 is a table of utilized by the diagnostic system of FIG. 1.
Figure 7:
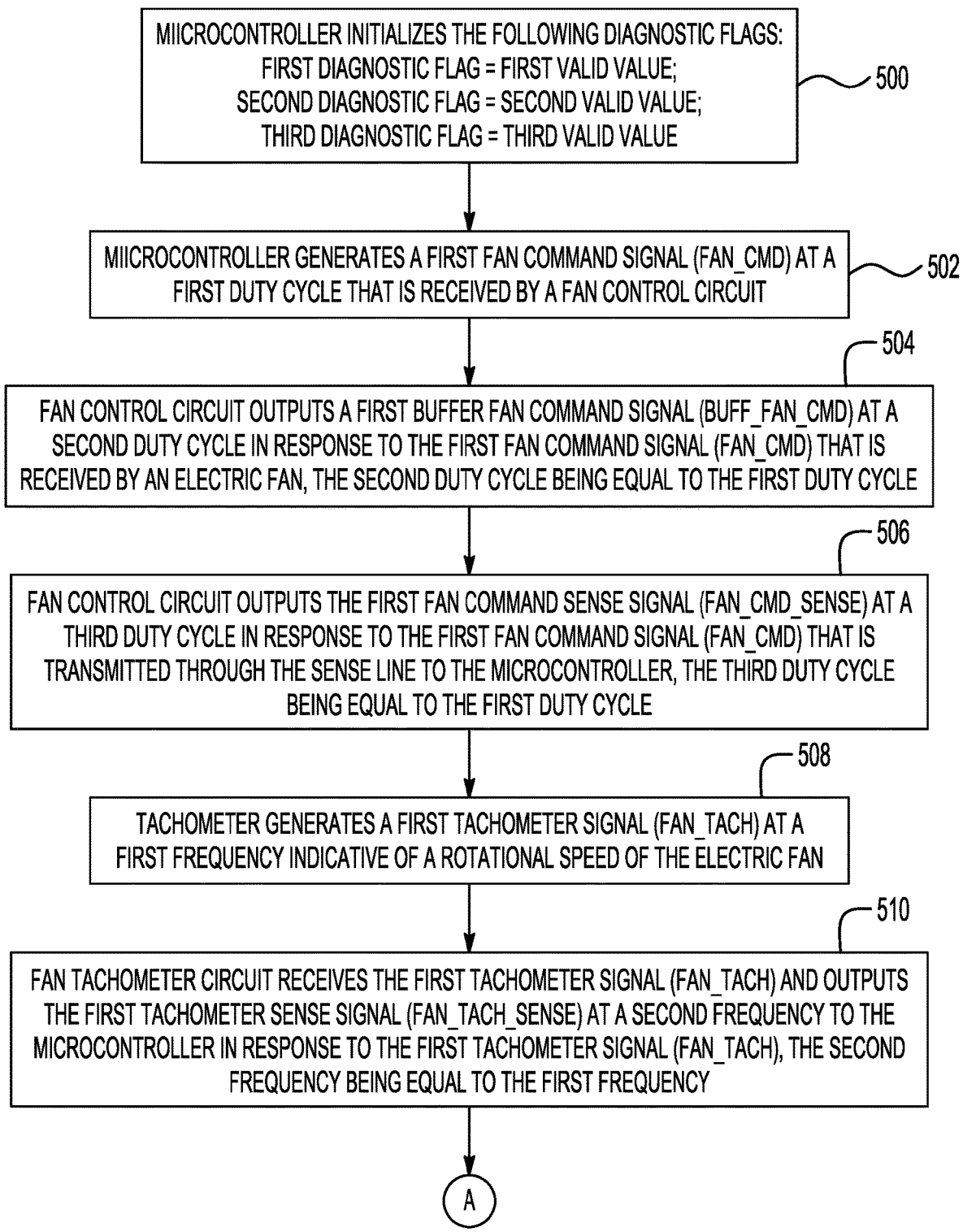
FIGS. 7-10 are flowcharts of a diagnostic method for a vehicle utilizing the diagnostic system of FIG. 1.
Figure 8:
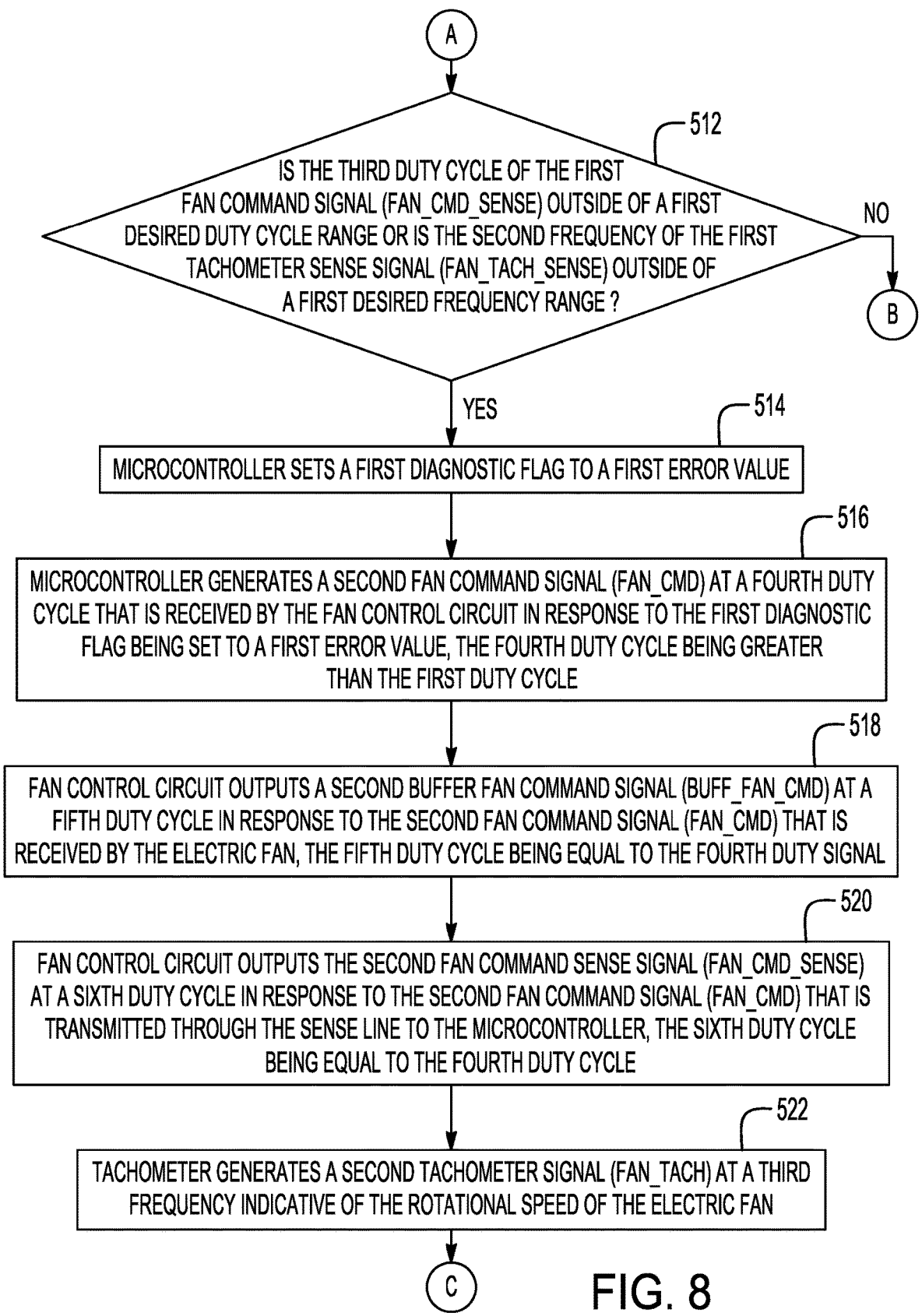
Figure 9:
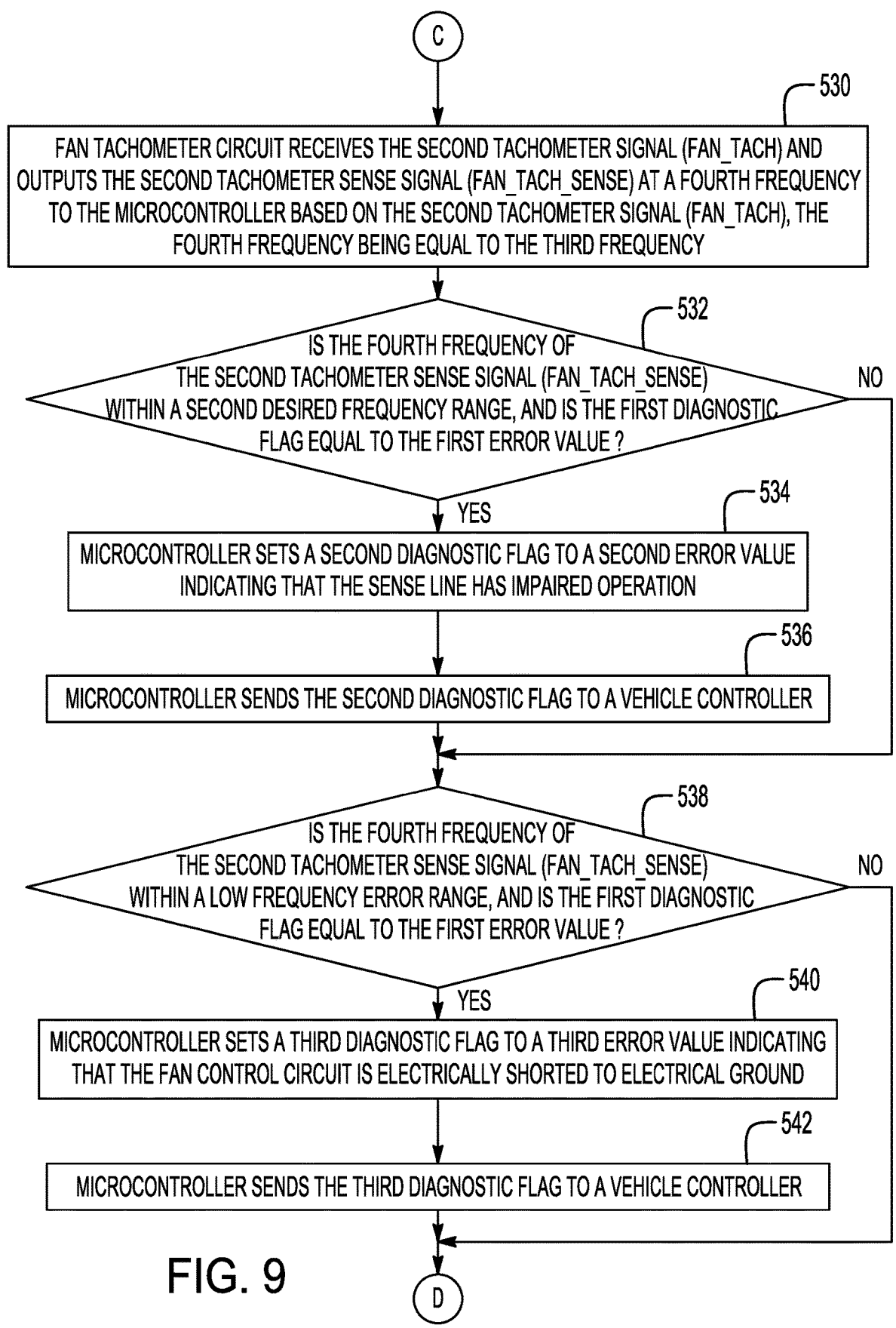
Figure 10:
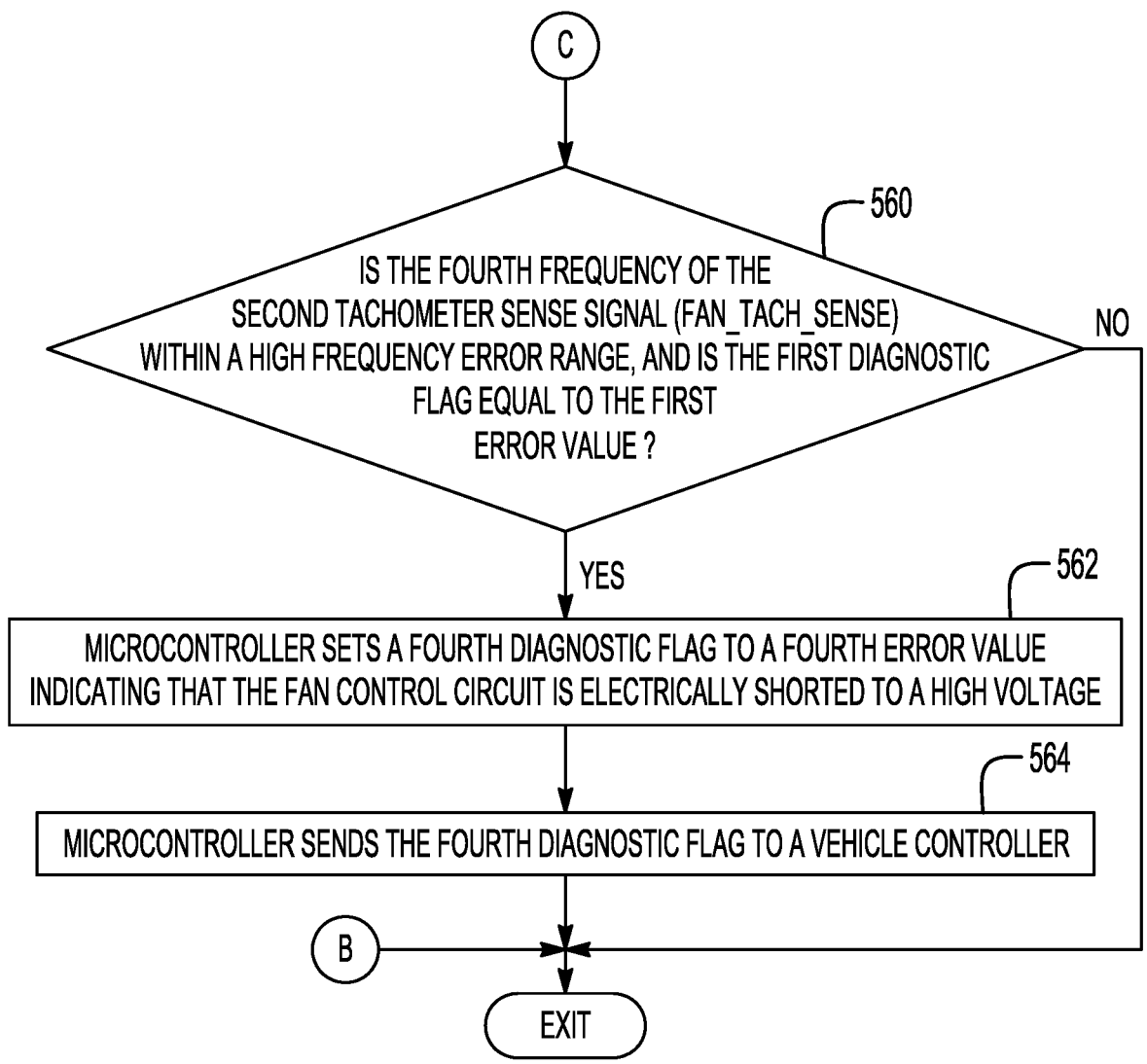

Referring to FIG. 6, a table 400 utilized by the microcontroller 50 for performing diagnostic tests discussed below, will be described. The table 400 includes records

402, 404, 406, 408, 410, 412, 414, 416, 418, 420. Each of the records 402-420 includes a FAN_CMD value, a FAN_CMD_SENSE minimum value, a FAN_CMD_SENSE maximum value, a FAN_TACH_SENSE minimum value, and FAN_TACH_SENSE maximum value. The FAN_CMD value indicates a commanded duty cycle value. The FAN_CMD_SENSE minimum value and the FAN_CMD_SENSE maximum value define a valid/pass range of the fan command sense signal FAN_CMD_SENSE when the fan command signal FAN_CMD is being output at a specific duty cycle. For example, referring to record 402, when the fan command signal FAN_CMD has a duty cycle of 10%, the valid/pass duty cycle range of the fan command sense signal FAN_CMD_SENSE is 20–0=20%. The FAN_TACH_SENSE minimum value and the FAN_TACH_SENSE maximum value define a valid/pass range of the fan tachometer sense signal FAN_TACH_SENSE when the fan command signal FAN_CMD is being output at a specific duty cycle. For example, referring to record 402, when the fan command signal FAN_CMD has a duty cycle of 10%, the valid/pass duty cycle range of the fan tachometer sense signal FAN_TACH_SENSE is 5–0=5%.

Figure 2:
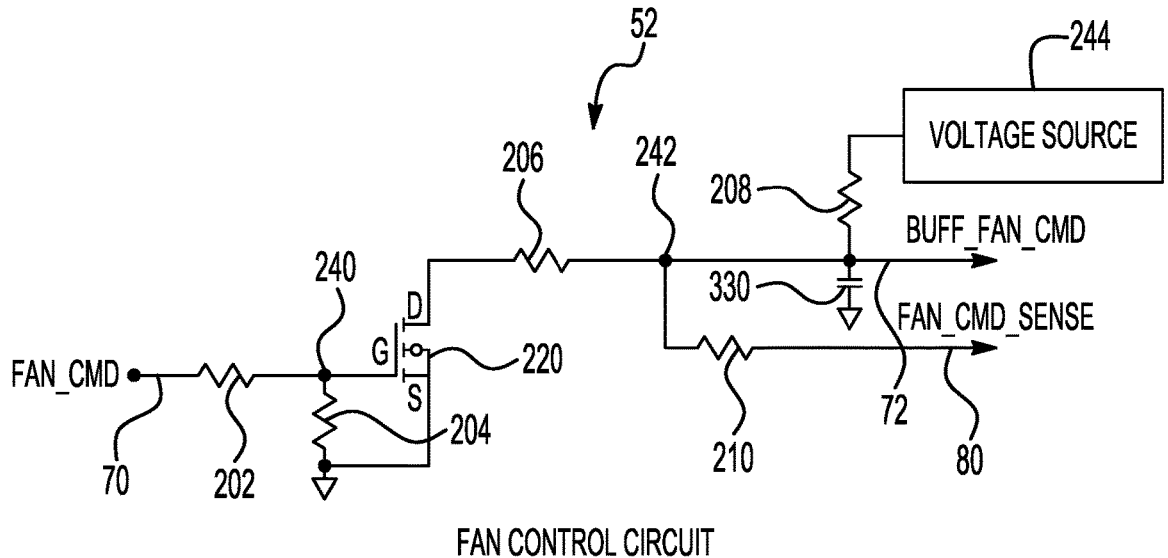
FIG. 2 is a schematic of fan control circuit utilized in the diagnostic system of FIG. 1.

Referring to FIGS. 1 and 2, the fan control circuit 52 is electrically coupled to the electric fan 40 via the electrical line 72, and to the microcontroller 50 via the electrical line 70. A sense line 80 is electrically coupled to and between the fan control circuit 52 and the microcontroller 50. The fan control circuit 52 outputs a buffer fan command signal (BUFF_FAN_CMD) at a duty cycle in response to the fan command signal (FAN_CMD), that is received by the electric fan 40. Referring to FIGS. 3 and 4, the duty cycle of the buffer fan command signal (BUFF_FAN_CMD) shown in exemplary signal 290 is equal to the duty cycle of the fan command signal (FAN_CMD) shown in exemplary signal 280. The fan control circuit 52 outputs a fan command sense signal (FAN_CMD_SENSE) at a duty cycle through the sense line 80 to the microcontroller 50. Referring to FIGS. 3 and 5, the duty cycle of the fan command sense signal (FAN_CMD_SENSE) shown as signal 300 is equal to the duty cycle of the fan command signal (FAN_CMD) shown as signal 280.

Referring to FIG. 2, the fan control circuit 52 includes resistors 202, 204, 206, 208, a field-effect transistor (FET) 220, a capacitor 230, electrical nodes 240, 242, and a voltage source 244. The resistor 202 is electrically coupled to and between the electrical line 70 and the electrical node 240. The resistor 204 is electrically coupled to and between the electrical node 240 and electrical ground.

The FET 220 includes a gate G, a source S, and a drain D. The gate G is electrically coupled to the electrical node 240, the source S is electrically coupled to electrical ground, and the drain D is electrically coupled to the resistor 206.

The resistor 206 is electrically coupled to and between the drain D and the electrical node 242. The resistor 210 is electrically coupled to and between the electrical node 242 and the sense line 80.

The resistor 208 is electrically coupled to and between the voltage source 244 and the electrical node 242. The capacitor 330 is electrically coupled to and between the electrical node 242 and electrical ground. Further, the electrical node 242 is further electrically coupled to the electrical line 72.

During operation, when the fan command signal (FAN_CMD) that is applied to the gate G has a high logic level, the FET 220 turns on, and the buffer fan command signal (BUFF_FAN_CMD) is a high logic level, and the voltage of the fan command sense signal (FAN_CMD_SENSE) is a high logic level. Alternately, when the fan command signal (FAN_CMD) that is applied to the gate G has a low logic level, the FET 220 turns off, and the buffer fan command signal (BUFF_FAN_CMD) is a low logic level, and the fan command sense signal (FAN_CMD_SENSE) is a low logic level.

Referring to FIG. 1, the tachometer 54 is operably coupled to the electric fan 40, and the tachometer 54 is electrically coupled to the fan tachometer circuit 56 utilizing the electrical line 74. The tachometer 54 generates a tachometer signal (FAN_TACH) at a frequency indicative of a rotational speed of the electric fan 40, that is received by the fan tachometer circuit 56. The tachometer signal (FAN_TACH) is a PWM signal.

The fan tachometer circuit 56 outputs a tachometer sense signal (FAN_TACH_SENSE) at a frequency in response to the tachometer signal (FAN_TACH) that is received by the microcontroller 50 via the electrical line 76. The frequency to the tachometer sense signal (FAN_TACH_SENSE) is equal to the frequency of the tachometer signal (FAN_TACH). The tachometer sense signal (FAN_TACH_SENSE) is a PWM signal.

Referring to FIGS. 1 and 6-10, a flowchart of a diagnostic method for the vehicle 10 will be explained.

At step 500, the microcontroller 50 initializes the following diagnostic flags: first diagnostic flag=first valid value; second diagnostic flag=second valid value; third diagnostic flag=third valid value. After step 500, the method advances to step 502.

At step 502, the microcontroller 50 generates a first fan command signal (FAN_CMD) at a first duty cycle that is received by a fan control circuit 52. For example, referring to FIG. 6, the microcontroller 50 accesses the table 400 at record 406 to obtain the FAN_CMD value of 30 for outputting the first fan command signal (FAN_CMD) at a 30% duty cycle. After step 502, the method advances to step 504.

At step 504, the fan control circuit 52 outputs a first buffer fan command signal (BUFF_FAN_CMD) at second duty cycle in response to the first fan command signal (FAN_CMD) that is received by an electric fan 40. The second duty cycle is equal to the first duty cycle. After step 504, the method advances to step 506.

At step 506, the fan control circuit 52 outputs the first fan command sense signal (FAN_CMD_SENSE) at a third duty cycle in response to the first fan command signal (FAN_CMD) that is transmitted through the sense line 80 to the microcontroller 50. The third duty cycle is equal to the first duty cycle. After step 506, the method advances to step 508.

At step 508, the tachometer 54 generates a first tachometer signal (FAN_TACH) at a first frequency indicative of a rotational speed of the electric fan 40. After step 508, the method advances to step 510.

At step 510, the fan tachometer circuit 56 receives the first tachometer signal (FAN_TACH) and outputs the first tachometer sense signal (FAN_TACH_SENSE) at a second frequency to the microcontroller 50 in response to the first tachometer signal (FAN_TACH). The second frequency is equal to the first frequency. After step 510, the method advances to step 512.

At step 512, the microcontroller 50 makes a determination as to whether the third duty cycle of the first fan command sense signal (FAN_CMD_SENSE) is outside of a first desired duty cycle range or whether the second frequency of the first tachometer sense signal (FAN_TACH_SENSE) is outside of a first desired frequency range. For example, referring to FIG. 6, the microcontroller 50 accesses the table 400 at record 406 to obtain the values 20 and 40 which corresponds to the first desired duty cycle range of 20%-40%. Next, the microcontroller 50 makes a determination as to whether the third duty cycle of the first fan command sense signal (FAN_CMD_SENSE) is outside of the first desired duty cycle range of 20%-40%. Further, the microcontroller 50 accesses the table 400 at record 406 to obtain the values 55 and 65 which corresponds to the first desired frequency range of 55 Hz-65 Hz. Next, the microcontroller 50 makes a determination as to whether the second frequency of the first tachometer sense signal (FAN_TACH_SENSE) is outside of 55 Hz-65 Hz. If the value of step 512 equals "yes", the method advances to step 514. Otherwise, the method is exited.

At step 514, the microcontroller 50 sets a first diagnostic flag to a first error value. After step 514, the method advances to step 516.

At step 516, the microcontroller 50 generates a second fan command signal (FAN_CMD) at a fourth duty cycle that is received by the fan control circuit 52 in response to the first diagnostic flag being set to the first error value. The fourth duty cycle is greater than the first duty cycle. For example, referring to FIG. 6, the microcontroller 50 accesses the table 400 at record 410 to obtain the FAN_CMD value of 50 for outputting the first fan command signal (FAN_CMD) at a 50% duty cycle. After step 516, the method advances to step 518.

At step 518, the fan control circuit 52 outputs a second buffer fan command signal (BUFF_FAN_CMD) at a fifth duty cycle in response to the second fan command signal (FAN_CMD) that is received by the electric fan 40. The fifth duty cycle is equal to the fourth duty cycle. After step 518, the method advances to step 520.

At step 520, the fan control circuit 52 outputs the second fan command sense signal (FAN_CMD_SENSE) at a sixth duty cycle in response to the second fan command signal (FAN_CMD) that is transmitted through the sense line 80 to the microcontroller 50. The sixth duty cycle is equal to the fourth duty cycle. After step 520, the method advances to step 522.

At step 522, the tachometer 54 generates a second tachometer signal (FAN_TACH) at a third frequency indicative of the rotational speed of the electric fan 40. After step 522, the method advances to step 530.

At step 530, the fan tachometer circuit 56 receives the second tachometer signal (FAN_TACH) and outputs the second tachometer sense signal (FAN_TACH_SENSE) at a fourth frequency to the microcontroller 50 based on the second tachometer signal (FAN_TACH). The fourth frequency is equal to the third frequency. After step 530, the method advances to step 532.

At step 532, the microcontroller 50 makes a determination as to whether the fourth frequency of the second tachometer sense signal (FAN_TACH_SENSE) is within a second desired frequency range, and whether the first diagnostic flag equal to the first error value. For example, referring to FIG. 6, the microcontroller 50 accesses the table 400 at record 410 to obtain the values 95 and 105 which corresponds to the second desired frequency range of 95 Hz-105 Hz. Next, the microcontroller 50 makes a determination as to whether the fourth frequency of the second tachometer sense signal (FAN_TACH_SENSE) is within the second desired frequency range of 95 Hz-105 Hz, and whether the first diagnostic flag is equal to the first error value. If the value of step 532 equals "yes", the method advances to step 534. Otherwise, the method advances to step 538.

At step 534, the microcontroller 50 sets a second diagnostic flag to a second error value indicating that the sense line 80 has impaired operation. After step 534, the method advances to step 536.

At step 536, the microcontroller 50 sends the second diagnostic flag to a vehicle controller 20. After step 536, the method advances to step 538.

At step 538, the microcontroller 50 makes a determination as to whether the fourth frequency of the second tachometer sense signal (FAN_TACH_SENSE) is within a low frequency error range, and whether the first diagnostic flag is equal to the first error value. For example, referring to FIG. 6, the microcontroller 50 accesses the table 400 at record 402 to obtain the values 0 and 5 which corresponds to the low frequency range of 0 Hz-5 Hz. Next, the microcontroller 50 makes a determination as to whether the fourth frequency of the second tachometer sense signal (FAN_TACH_SENSE) is within 0 Hz-5 Hz, and whether the first diagnostic flag is equal to the first error value. If the value of step 538 equals "yes", the method advances to step 540. Otherwise, the method advances to step 560.

At step 540, the microcontroller 50 sets a third diagnostic flag to a third error value indicating that the fan control circuit 52 is electrically shorted to electrical ground. After step 540, the method advances to step 542.

At step 542, the microcontroller 50 sends the third diagnostic flag to a vehicle controller 20. After step 542, the method advances to step 560.

At step 560, the microcontroller 50 makes a determination as to whether the fourth frequency of the second tachometer sense signal (FAN_TACH_SENSE) is within a high frequency error range, and whether the first diagnostic flag is equal to the first error value. For example, referring to FIG. 6, the microcontroller 50 accesses the table 400 at record 420 to obtain the values 145 and 155 which corresponds to the high frequency error range of 145 Hz-155 Hz. Next, the microcontroller 50 makes a determination as to whether the fourth frequency of the second tachometer sense signal (FAN_TACH_SENSE) is within 145 Hz-155 Hz, and whether the first diagnostic flag is equal to the first error value. If the value of step 560 equals "yes", the method advances to step 562. Otherwise, the method is exited.

At step 562, the microcontroller 50 sets a fourth diagnostic flag to a fourth error value indicating that the fan control circuit 52 is electrically shorted to a high voltage. After step 562, the method advances to step 564.

At step 564, the microcontroller 50 sends the fourth diagnostic flag to a vehicle controller 20. After step 564, the method is exited.

The diagnostic system 30 described herein provides a substantial advantage over other systems. In particular, the diagnostic system 30 determines when a fan control circuit 52 controlling operation of electric fan 40 is electrically shorted to electrical ground or a high voltage, or when a voltage sense line 80 coupled to the fan control circuit 52 has impaired operation (e.g., is broken or electrically non-conductive).

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle, comprising:
a fan control circuit electrically coupled to an electric fan and a microcontroller, and a sense line electrically coupled to the fan control circuit and the microcontroller;
the microcontroller generating a first fan command signal at a first duty cycle that is received by the fan control circuit;
the fan control circuit outputting a first buffer fan command signal at a second duty cycle in response to the first fan command signal that is received by the electric fan; the second duty cycle being equal to the first duty cycle; the fan control circuit outputting a first fan command sense signal at a third duty cycle through the sense line to the microcontroller, the third duty cycle being equal to the first duty cycle;
a tachometer generating a first tachometer signal at a first frequency indicative of a rotational speed of the electric fan;
a fan tachometer circuit outputting a first tachometer sense signal at a second frequency in response to the first tachometer signal that is received by the microcontroller, the second frequency being equal to the first frequency;
the microcontroller setting a first diagnostic flag to a first error value if the third duty cycle is outside of a first desired duty cycle range or the first tachometer sense signal is outside of a first desired frequency range; the microcontroller generating a second fan command signal at a fourth duty cycle that is received by the fan control circuit in response to the first diagnostic flag being set to the first error value;
the fan control circuit outputting a second buffer fan command signal at a fifth duty cycle in response to the second fan command signal that is received by the electric fan, the fifth duty cycle being equal to the fourth duty cycle; the fan control circuit outputting a second fan command sense signal at a sixth duty cycle through the sense line to the microcontroller, the fifth duty cycle being equal to the fourth duty cycle;
the tachometer generating a second tachometer signal at a third frequency indicative of the rotational speed of the electric fan;
the fan tachometer circuit receiving the second tachometer signal and outputting the second tachometer sense signal at a fourth frequency to the microcontroller in response to the second tachometer signal, the fourth frequency being equal to the third frequency; and
the microcontroller setting a second diagnostic flag to a second error value indicating that the sense line has impaired operation if the fourth frequency is within a second desired frequency range, and the first diagnostic flag is equal to the first error value.

2. The diagnostic system of claim 1, further comprising:
transmitting the second diagnostic flag to a vehicle controller.

3. The diagnostic system of claim 1, wherein:
the microcontroller setting a third diagnostic flag to a third error value indicating that the fan control circuit is electrically shorted to electrical ground if the fourth frequency is within a low frequency error range, and the first diagnostic flag is equal to the first error value.

4. The diagnostic system of claim 3, wherein:
the low frequency error range corresponds to 0-5 Hertz.

5. The diagnostic system of claim 3, further comprising:
transmitting the third diagnostic flag to a vehicle controller.

6. The diagnostic system of claim 3, wherein:
the microcontroller setting a fourth diagnostic flag to a fourth error value indicating that the fan control circuit is electrically shorted to a high voltage if the fourth frequency is within a high frequency error range, and the first diagnostic flag is equal to the first error value.

7. The diagnostic system of claim 6, wherein:
the high frequency error range corresponds to 145-155 Hertz.

8. The diagnostic system of claim 6, further comprising:
transmitting the fourth diagnostic flag to a vehicle controller.

9. The diagnostic system of claim 1, wherein:
the first fan command signal is a first PWM signal; and
the first fan command sense signal is a second PWM signal.

10. The diagnostic system of claim 9, wherein:
the second fan command signal is a third PWM signal, and the fourth duty cycle of the second fan command signal being greater than the first duty cycle of the first fan command signal; and
the second fan command sense signal is a fourth PWM signal.

11. The diagnostic system of claim 10, wherein:
the first tachometer sense signal is a fifth PWM signal; and
the second tachometer sense signal is a sixth PWM signal.

* * * * *